United States Patent [19]
Leong

[11] Patent Number: 5,212,663
[45] Date of Patent: May 18, 1993

[54] METHOD TO IMPLEMENT A LARGE RESETTABLE STATIC RAM WITHOUT THE LARGE SURGE CURRENT

[75] Inventor: Raymond M. Leong, Los Altos, Calif.

[73] Assignee: Cypress Semiconductor Corporation, San Jose, Calif.

[21] Appl. No.: 658,559

[22] Filed: Feb. 21, 1991

[51] Int. Cl.⁵ .............................................. G11C 7/00
[52] U.S. Cl. ................. 365/189.01; 365/218
[58] Field of Search ............................ 365/218, 189.01

[56] References Cited

U.S. PATENT DOCUMENTS 4,975,873 12/1990 Nakabayashi et al. ......... 365/189.01

FOREIGN PATENT DOCUMENTS 0043897 2/1989 Japan .............................. 365/189.01

Primary Examiner—William L. Sikes
Assistant Examiner—Margaret R. Wambach
Attorney, Agent, or Firm—Roger S. Borovoy

[57] ABSTRACT

A resettable SRAM architecture and method that eliminates the need to reset all memory cells in the data memory array and requires only the resetting of one flag bit per block of data. This prevents superfluous activation of access circuits and memory cell transistors, thereby reducing power consumption and parasitic noise.

11 Claims, 4 Drawing Sheets

METHOD TO IMPLEMENT A LARGE RESETTABLE STATIC RAM WITHOUT THE LARGE SURGE CURRENT

BACKGROUND OF THE INVENTION

The present invention relates to semiconductor random access memory (RAM) and more particularly relates to an improved architecture of a static RAM (SRAM) having a simultaneous multibyte data clearing function.

DESCRIPTION OF THE RELEVANT ART

SRAM architectures using array data reset functions are well known in the art. One example is the FIFO (First-In-First-Out) SRAM, such as the CY7C401 from Cypress Semiconductor Inc. of San Jose, Calif. The CY7C401 is used in digital video display instruments, digital communication instruments and in other data processing applications. Typical of prior art resettable RAM components, the CY7C401 is very low density (64 words by 4 bits, totalling 256 bits). This low density allows the simultaneous clearing of the entire array without causing power surge noise on the power rail of the selected chip. Such power rail noise is not desirable for it may cause parasitic data alteration in other memory components in the typical system which uses many FIFO chips.

The general trend in the semiconductor industry has been to increase the number of memory bits on a given chip in order to reduce the cost per logic function or memory bit, which in return increases manufacturing productivity. Cost per bit reductions of dynamic RAMs, microprocessors, custom gate arrays and even standard SRAMs have dramatically reduced manufacturing cost for high performance engineering workstations.

However, increasing the density of resettable SRAMs, such as FIFOs, was particularly difficult, principally due to the noise caused by the current surge on the power supply rail associated with the simultaneous clearing of a large number of bits in a single chip. This power surge noise prevented chip designers from increasing chip size and thus prevented cost reduction.

Prior art attempts at solving the power surge noise problem of high density resettable SRAMs were made by sequentially resetting portions of the array, such as along one word line at the time, rather than the entire chip at once, thereby reducing the noise from the start-up power surge. One example of this approach is illustrated in U.S. Pat. No. 4,949,308. However, the sequential reset approach is time consuming because it indiscriminately resets (clears) the data in the memory cells along an entire word-line even though that word line had not been altered previously.

It is an object of the present invention to reduce power surge noise by significantly reducing the number of memory bits affected by the resetting procedure, yet still obtaining the effect of all memory bits having been reset.

SUMMARY OF THE INVENTION

The present invention reduces power surge noise by identifying word lines whose data was not previously altered and flagging a corresponding bit for that line, for example to "1" logic state. By creating a logical relationship between the flag bit and the sensed data bits, the present invention allows the resettable SRAM chip to present a "0" output logic state for all bits of the selected data when the selected data flag bit is set to a "1" logic state—irrespective of the actual content of the data in the memory cells.

The technique of this invention eliminates the need to reset all the memory cells in the array and requires only the resetting of one flag bit for a selected amount of data. This prevents superfluous activation of access circuits and memory cell transistors, thereby reducing power consumption and parasitic noise, particularly during reset. The technique of this invention allows the increase of memory bit density on a single resettable SRAM chip, thereby reducing cost per bit and increasing manufacturing productivity both of chips and computer end products.

Briefly, the resettable SRAM of the invention includes an array of M rows and N+P columns of memory cells having a first array portion of M rows and N columns storing a first block of data and a second array portion of M rows and P columns storing a second block of data, each byte in the first array portion having a corresponding flag bit in the second array portion; a plurality of control means, one for each bit in the byte, each control means having a plurality of inputs, one of which is coupled to receive the flag bit from the second array portion and the other of which is coupled to receive one of the bits of the byte in the first array portion, the outputs of the control means being coupled to a data bus, whereby the condition of the flag bit provides to the bus an indication of the validity of the data in that byte.

DETAILED DESCRIPTION OF THE INVENTION

Figure 1:
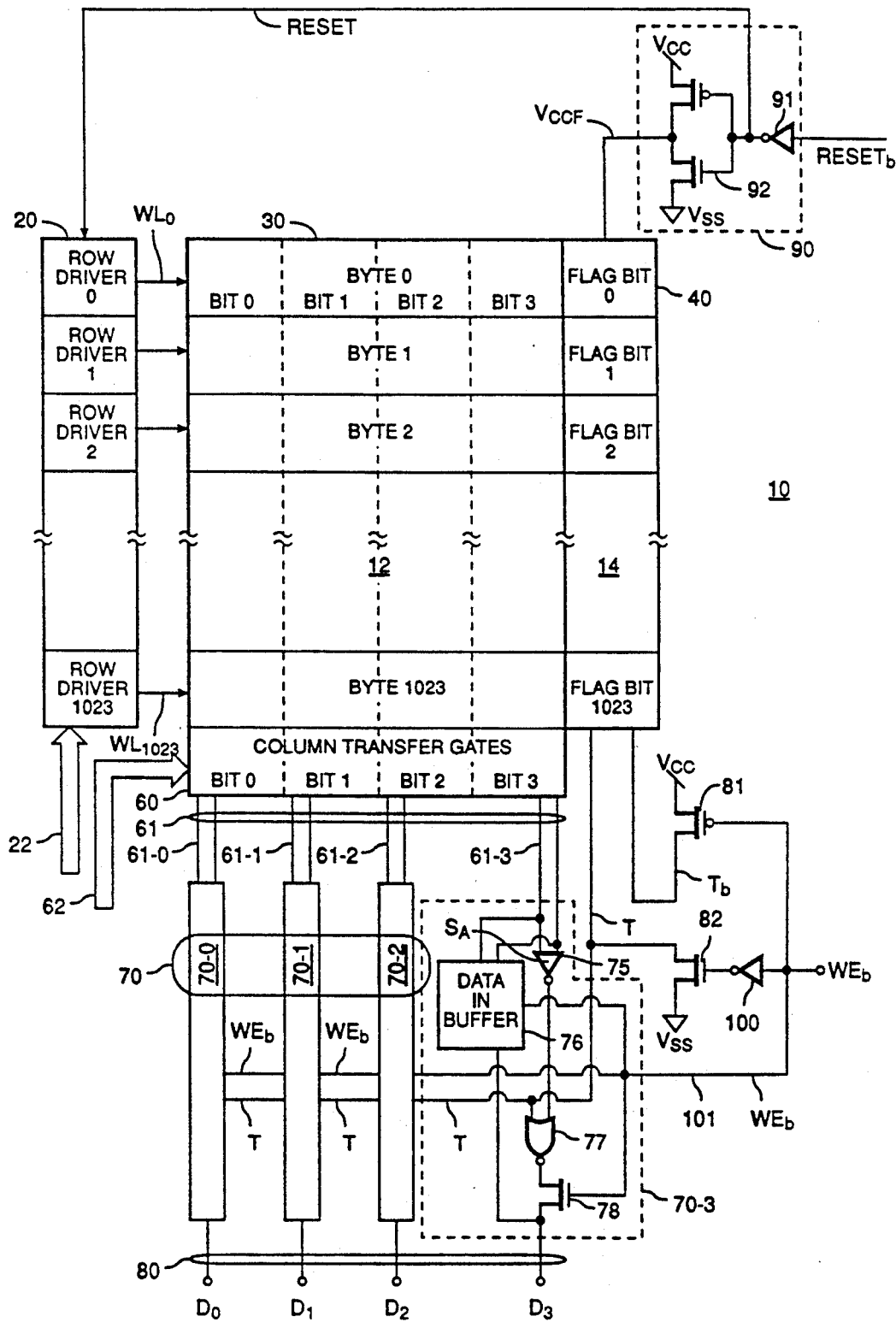
FIG. 1 is a detailed block diagram of an SRAM memory chip of a first embodiment of the invention.

FIG. 1 depicts the overall functional block diagram of one embodiment of the resettable SRAM of this invention. Referring to FIG. 1, the resettable SRAM is indicated generally at 10. Resettable SRAM 10 comprises an array of data memory cells 12. Resettable SRAM 10 of this preferred embodiment stores 4096 bits of data memory and 1024 flag bits in a single column 14. The data memory is organized as 1024 words of 4 bits each. The words or "bytes" are located in area 30 in FIG. 1. Each byte has a corresponding flag bit in column 40 along its respective word line in the memory array 12. Since this embodiment uses 4-bit words, the addition of the flag bit brings the total number of memory cells along each word line to five. The terms "byte" and "word" are used interchangeably to denote a plurality of bits.

As is well known in the art, an SRAM memory matrix is made up of rows and columns and is driven by row driver 20 in FIG. 1, which responds to the decoded row address bus input 22 and column transfer gate block 60, which in turn responds to the column control input from bus 62.

During a read operation, the decoded data from array 12 is delivered to input/output buffers 70-0, 70-1 and 70-2 through 4-bit bus 61-0, 61-1 and 61-2, respectively, and from there to data bus 80. During a write operation, data from data bus 80 is transferred by input/output buffers 70, through bus 61 and column transfer gate block 60 to the memory cells of the selected data area 30.

In prior art resettable SRAMs, the entire 4096 memory cells in array 12 were reset by applying a "0" logic level onto bus 61 and simultaneously selecting the output of each of row driver 20 by setting each of them to "1" logic state, such that all word lines in area 30 are selected. This causes a large current surge from the power rail into the memory cells of array 12 and consequently causes a noise spike which often interferes with proper operation of other components in the system.

The present invention significantly reduces the current surge on the power rail and resultant noise spike by resetting only the one additional flag bit 40 in additional column 14 for each byte 30 in the array 12, thus avoiding the requirement to reset each bit of the entire array.

Figure 2:
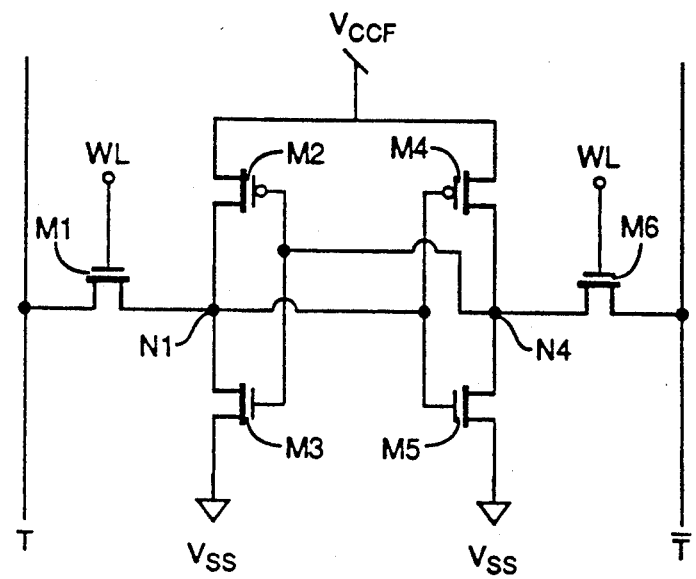
FIG. 2 is a circuit diagram of a six-transistor SRAM memory cell commonly used in the art.

A typical CMOS SRAM memory cell 31 is illustrated in FIG. 2. This cell may be used for each of the data bits in area 30 shown in FIG. 1 as well as for flag bits 40. As is well known in the art, the memory bits in area 30 will use cell 31 with minimum equal sizes for PMOS transistors $M_2$ and $M_4$. However in this embodiment, it is preferable for cell 31, where used for a flag bit 40, to have a PMOS transistor $M_2$ width about twenty percent larger than the width of PMOS transistor $M_4$ while having a substantially equal channel length. This is done in order to enable the simultaneous resetting of an entire column of flag bits 40, as will be described hereinafter.

Referring both to FIGS. 1 and 2, the reset procedure of flag bits 40 is initiated by taking the $RESET_b$ input shown in FIG. 1 to the "0" logic state, and then bringing it up to the "1" logic state a short time thereafter. This pulse is delivered to the $V_{CCF}$ power rail (FIG. 2) of the flag bits by the RESET buffer 90 shown in FIG 1. RESET buffer 90 includes CMOS inverters 91 and 92 which, during normal SRAM read/write operations, provide a $V_{CC}$ level of 5 volts to the $V_{CCF}$ rail of the flag bit 40 to ensure normal operation. The complement signal of $RESET_b$ at the output of inverters 91 and 92 is the signal RESET, which connects to the inputs of row decoders 20.

When a $RESET_b$ pulse arrives at the input of buffer 90, the $V_{CCF}$ rail is taken to $V_{SS}$ of 0 volts for the duration of the pulse. This causes the voltage of storage nodes $n_1$ and $n_4$ (FIG. 2) of all cells of the flag bits 40 in column 14 to be at 0 volts. When the RESET signal goes to a "1" logic state and arrives at the input of row driver 20, shown in FIGS. 1 and 3, the NOR gate 20 output at node $W_L$ (word line) goes to a "0" logic state of 0 volts regardless of the information on row address bus input 22. Since the RESET signal connects to the inputs of all row decoders 20, all word lines will be at 0 volts, thus disconnecting all memory cells from their associated bit lines and preventing unnecessary current flow into the memory cells from the bit lines.

Referring to FIG. 1, during the RESET period, the $WE_b$ input to CMOS inverter 100 is held at a "1" logic state of 5 volts, which turns off PMOS transistor 81. The $WE_b$ signal is then inverted by CMOS inverter 100, which outputs the signal WE to turn off NMOS transistor 82. By turning off both transistors 81 and 82, it is ensured that the bit lines T and $T_b$ of the flag bit column 14 are affected only by voltages from the memory cells of the flag bits 40 at the end of the RESET period.

At the end of the RESET period, the $RESET_b$ input is taken to a "1" logic state, which causes the $V_{CCF}$ potential to rise from 0 volts to 5 volts, which in turn causes all flag bits 40 to have 5 volts on node $n_1$ (FIG. 2) and 0 volts on node $n_4$. This corresponds to a "1" logic state on bit line T and a "0" logic state on bit line $T_b$. Having a "1" logic state on signal T, which is also connected to NOR gates 77 in the input/output buffers 70, causes all bits of data bus 80 to be at a "0" logic state.

As shown in FIG. 2, the reason cell 31 will settle to a "1" state at node $n_1$ is that PMOS transistor $M_2$ has larger current drive caused by its larger gate width in comparison to PMOS transistor $M_4$, thereby charging node $n_1$ faster than PMOS transistor $M_4$ charges node $n_4$. This asymmetry in the load transistors $M_1$ and $M_4$ of the SRAM cell of FIG. 2 has been used in the art and in particular in SRAM memories to bias the entire array into a preferred logic state immediately after the connection of the system to a power supply. However it has not been used as a flag bit.

Figure 3:
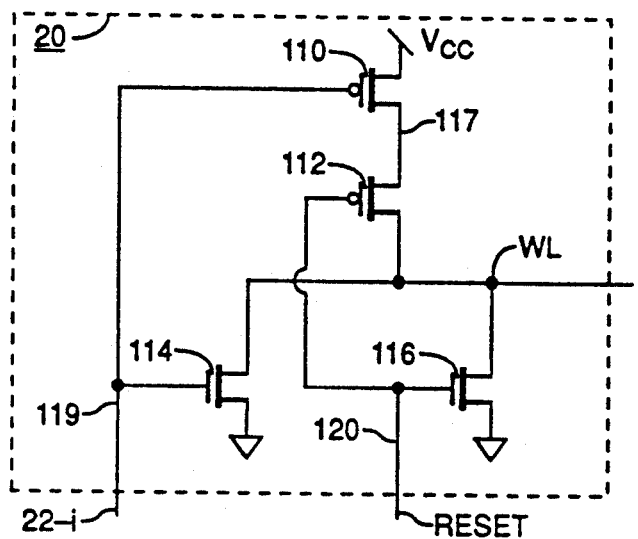
FIG. 3 is a circuit diagram of the row driver used in the present invention.

FIG. 3 is a schematic of the word line driver 20, which is a NOR gate with two inputs. NOR gate 20 comprises pull-up PMOS transistor 110 having its source connected to the $V_{CC}$ rail, its gate connects to input line 119 and its drain connects to node 117, which is also the source of pull-up PMOS transistor 112. The gate of transistor 116 is connected to input 120 and its drain is connected to the output node WL of NOR gate 20 Pull-down NMOS transistor 114 has its drain connected to output node WL, its gate to input line 119, its source to $V_{SS}$ Pull-down NMOS transistor 116 has its drain connected to output node WL, its gate to input line 120 and its source to $V_{SS}$. Line 119 connects to one line 22-i of the 1024 lines of bus 22 (FIG. 1). For example, row driver No. 0 in FIG. 1 will have its input line 119 connected to line 22-0 of bus 22; row driver No. 1023 in FIG. 1 will have its input line 119 connected to line 22-1023 of bus 22. Input line 120 of each of the 1024 row drivers 20 connects to the reset signal RESET of FIG. 1. The output node WL of each row driver 20 connects to only one word line in the array 12.

Figure 4:
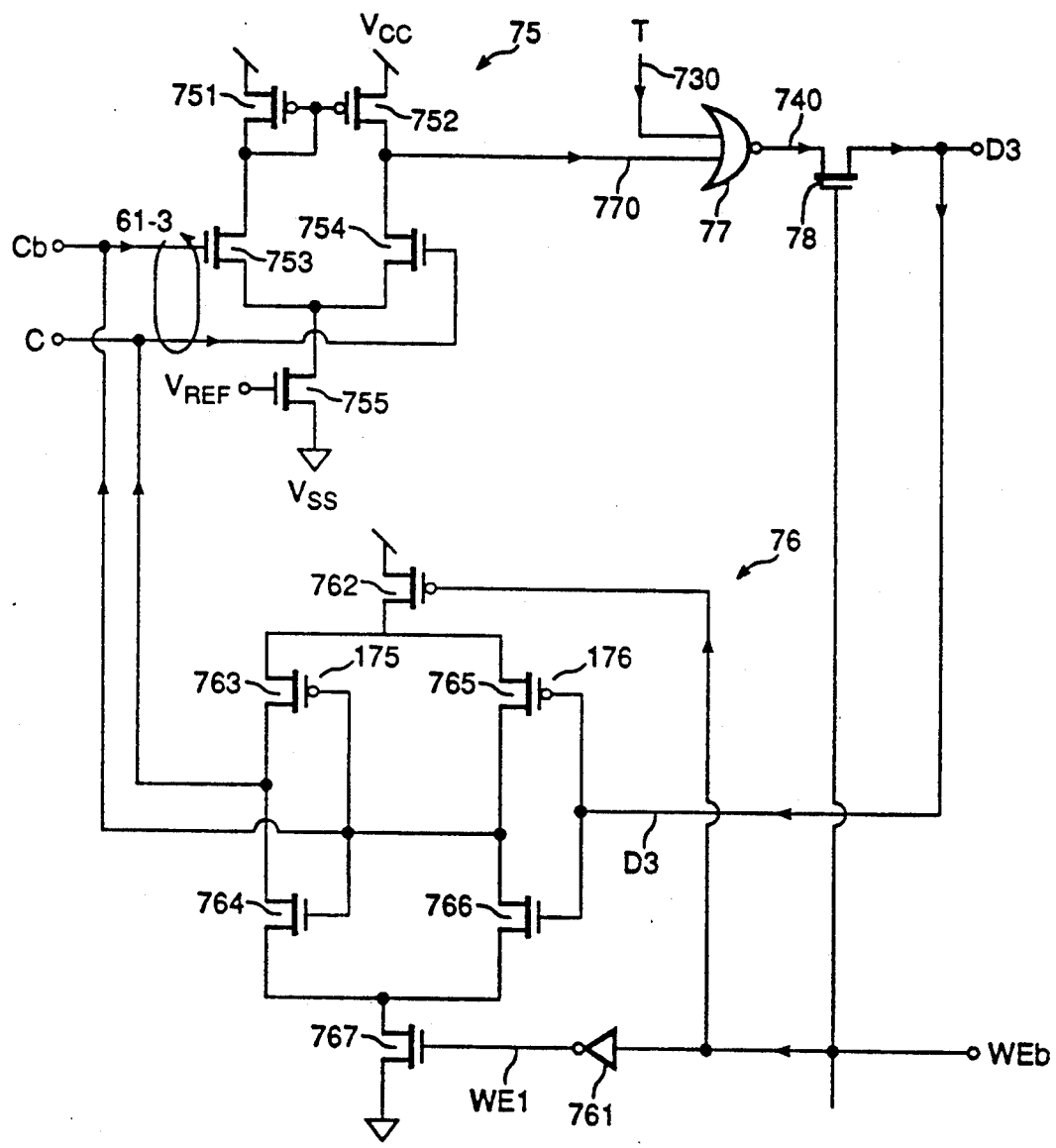
FIG. 4 is a circuit diagram of the input/output buffer of the present invention.

FIG. 4 illustrates one of the input/output buffers 70 of FIG. 1 in more detail. The inverting sense amplifier 75 is well known in the art and uses PMOS load transistors 751 and 752, NMOS input transistors 753 and 754 and a common mode NMOS transistor 755 whose gate is biased by a reference voltage $V_{REF}$. The inputs to sense amplifier 75 come on bus 61-3 and carry a differential signal from the SRAM memory cells, as is known in the art. The output of sense amplifier 75 connects to the input of flag-NOR gate 77 by bus 770. The other input to flag-NOR gate 77 comes from the flag bit 40 on signal line 730.

The output of the flag-NOR gate 77 on line 740 goes to a transfer NMOS transistor 78, whose gate is controlled by the $WE_b$ signal. When the $WE_b$ signal is at a "1" logic state during read operations, the output of flag-NOR gate 77 will be transferred to one bit of the data bus $D_3$. However during write or reset operations nodes 740 and $D_3$ will be disconnected by transistor 78.

The data-in buffer 76 receives a data input signal $D_3$ and control input signal $WE_b$. The data-in buffer 76 employs inverter 761, inverter 175, inverter 176 and supply rail transistors including PMOS transistor 762 and NMCS transistor 767.

During read operations, the $WE_b$ input is held at a "1" logic state of 5 volts so that PMOS transistor 762 remains off and the inverted signal $WE_1$ turns off NMOS transistor 767. Turning transistors 762 and 767 off cuts the supply voltage from inverters 175 and 176 and prevents any current flow through transistors 763, 764, 765 and 766, which therefore places a high impedance on bus 61-3, called the "tri-state" condition.

During the write operation, the input signal $WE_b$ is held at a "0" logic state of 0 volts and transistors 762 and 767 therefore turn on, which enable inverters 175 and 176 to operate normally. That is, input from data bus $D_3$ is inverted by inverter 176 and supplied to line $C_b$ of bus 61-3. Signal $C_b$ is inverted again by inverter 175 to create a complement signal line C. Signals C and $C_b$ are supplied to the bit lines of the selected cell of the selected word.

When $WE_b$ is at the "0" state, NMOS transistor 78 is turned off in order to prevent feedback and other interaction between line 740 and data line $D_3$, which is also the input of the data into buffer 76.

Figure 5:
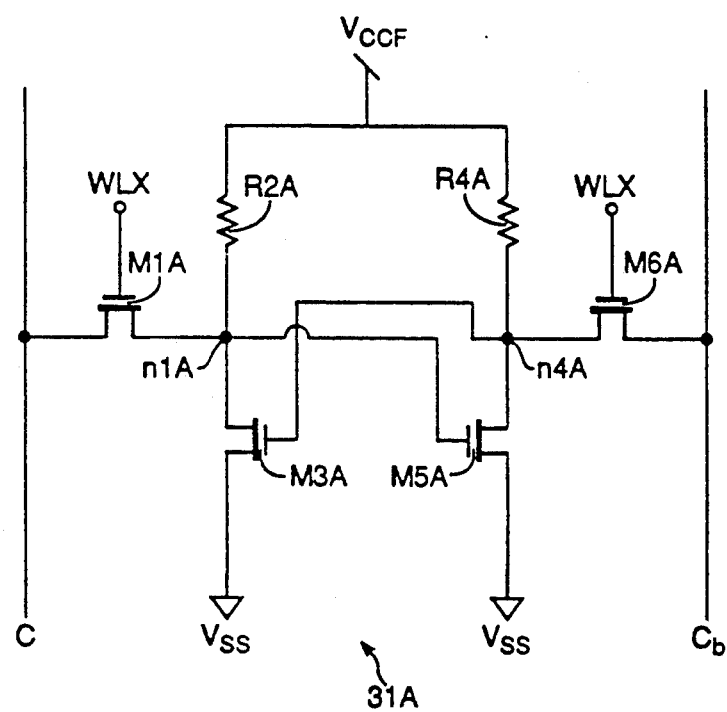
FIG. 5 is a circuit diagram of a SRAM memory cell commonly used in the art.

FIG. 5 shows a circuit schematic of a memory cell 31A with four transistors and two resistors as is well known in the art. Resistor R2A is connected between the $V_{CC}$ rail and storage node n1A; resistor R4A is connected between the $V_{CC}$ rail and storage node n4A. Pull-down transistor M3A has its drain connected to storage node n1A, its source to $V_{SS}$ and its gate to storage node n4A. Pull-down transistor M5A has its drain connected to storage node n4A, its source to $V_{SS}$ and its gate to storage node n1A. The memory cell 31A is a static latch. Transfer NMOS transistor M1A is connected between storage node n1A and the true bit-line C with its gate connected to word line node $W_LX$. Transfer NMOS transistor M6A is connected between storage node n4A and complement bit-line $C_b$, with its gate connected to word line node $W_LX$. As is known in the art, the true bit-line C and the complement bit-line $C_b$ comprise a column and are used to read and write into memory cell 31A when a selected word line connected to node $W_LX$ is selected and brought to 5 volts.

The alteration of a particular flag bit 40 to a "0" logic state on node $n_1$ in order to indicate that the bits of a corresponding word were altered by a write operation (in other words data had been written), will now be described in reference to FIG. 1.

Once the row address is chosen on bus 22 and the column address is chosen on bus 62 for a particular word in word area 30, for example byte number 0, its word line $W_L$-0 will be activated by the row decoder 20, number 0. Since the word of word line 30, number 0, is also the word line of flag bit 40, number 0, all connections between the bit lines and the memory cells along that word line will be conducting through each of the memory cell's transfer gates of NMOS transistors $M_1$ and $M_6$, shown in FIG. 2.

During the write operation, the $WE_b$ signal is held at 0 volts and data presented to SRAM 10 on data bus 80 is transferred through data-in buffer 76 to bus 61 and from there to the word memory cells. The $WE_b$ signal on line 101 also causes NMOS transistor 78 to turn off, thereby electrically isolating NOR gate 77 from data bus 80.

While word number 0 of word area 30 is altered, the $WE_b$ signal simultaneously causes the memory cell data of flag bit 40, number 0, to flip, so that bit line T displays a "0" logic state and bit line $T_b$ displays a "1" logic state. This occurs because bit line T of flag column 14 is pulled to voltage $V_{SS}$ of 0 volts by NMOS transistor 82 while bit line $T_b$ of flag column 14 is pulled to voltage $V_{CC}$ of 5 volts by PMOS transistor 81.

After the write operation has been completed, SRAM 10 enters the read operation when the $WE_b$ input signal is taken to 5 volts. Transistors 81 and 82 then turn off and NMOS transistor 78 turns on, connecting the output of NOR gate 77 to data bus 80. At the same time the $WE_b$ signal causes the outputs of data-in buffer 76 to be at a high impedance so that no current can flow in or out of data-in buffer 76 to bus 61. This condition of the output of the data-in buffer 76 also is called the tri-state condition.

During the read operation of word 30, number 0, the memory cell data from array 12 is presented on bus 61 and is amplified by inverting sense amplifier 75, to be presented at the input of NOR gate 77. If a "1" logic state is read on bit line T of flag bit 40, number 0, indicating that no alteration of word 30, number 0 has occurred, then all bits of data bus 80 will exhibit a "0" logic state. However, if a "0" logic state is read on bit line T of flag bit 40, number 0, indicating that these had been an alteration of word 30, number 0, then the bits of data bus 80 will exhibit the actual information of word 30, number 0.

Although the example of FIG. 1 described a four-bit word, any even or odd number of bits may be used to constitute a word. Typical numbers of bits per word are 8 (also called a byte), 16, 32 and any power of the number 2 used in the design of binary logic-based, digital systems.

The cost efficiency of the present invention increases as the number of bits per word increases because the percent of silicon area devoted to the flag bit decreases as the number of bits per word increases. For example, one flag bit for a four-bit word constitutes a 25 percent overhead. Thus more than a 21 percent improvement can be obtained by having one flag bit for a 32-bit word, where there will only be 3.125 percent overhead.

Another architecture is produced by having array 12 constructed from a plurality of interleaved bits of unrelated bytes, as is the common practice in the art, in which case the corresponding flag columns 14 will also be interleaved to form an independent flag array which may be reset sequentially, one flag column at a time. Alternatively all flag columns may be reset simultaneously.

Alternatively an architecture, including a dedicated array of flag bits having its own row and column decoders and read and write circuitry may be added to any existing SRAM memory within a monolithic chip or as a separate chip. The modification to the monolithic chip with the two arrays will be in the data-out path, whereby an output NOR control gate similar to flag-NOR gate 77 of FIG. 4 is used to allow the flag bit array to control the information on data bus 80. The advantage of having two separate arrays with dedicated access and control circuitry is that the memory cells of the two arrays may be constructed using different semiconductor devices. For example the data array which has a large number of cells can be optimized for smaller physical size by using the two polysilicon resistors and the four-transistor memory cell of FIG. 5, while the flag bit array can be optimized to achieve faster read access time by using the six-transistor cell of FIG. 2.

While preferred embodiments of the invention have been described, various substitutions and alternatives will be apparent to persons skilled in the art apprised by the teaching of this patent. It is therefor not intended that the invention be limited to the described embodiments, but only as defined by the appended claims.

What is claimed is:

1. A resettable static random access memory comprising:
   an array of M rows and N+P columns of memory cells having a first array portion of M rows and N columns storing a first block of data and a second array portion of M rows and P columns storing a second block of data;
   each byte in said first array portion having a corresponding flag bit in said second array portion;
   said memory cells in all P columns of said second array portion being simultaneously reset to a preferred logic state by changing the voltage of a first power supply rail to the value of the voltage of a second power supply rail and then returning the voltage of said first power supply rail to its original value;
   a plurality of control means, one for each bit of said byte, each control means having a plurality of inputs, one of which is coupled to receive said flag bit from said second array portion and the other of which is coupled to receive one of the bits of said byte in said first array portion;
   the outputs of said control means being coupled to a data bus, whereby the condition of said flag bit provides to said bus an indication of the validity of the data in said byte.

2. The invention of claim 1 where said entire second array portion containing said flag bits is reset to a first logic state before a write operation into said first array portion is initiated;
   where said flag bits are altered to a second logic state if their corresponding data in said first array portion has been altered after said reset operation; and
   where the presence of said second logic state of a selected flag bit forces said control means to drive a desired logic combination onto said data bus.

3. The invention of claim 1 where said first array portion of M rows and N columns and said second array portion of M rows and P columns are juxtaposed.

4. The invention of claim 1 where said N columns of said first array portion are interleaved with said P columns of said second array portion.

5. A static random access memory comprising;
   an array of M rows and N+P columns of memory cells;
   a first array portion of M rows and N columns storing a first block of data;
   a second array portion of M rows and P columns storing a second block of data;
   said M rows being physically continued from said first array portion to said second array portion and coupled to M corresponding common row drivers and M corresponding word lines;
   each row in said first array portion storing P bytes each having Q bits and each selected byte in said P bytes having a corresponding flag bit in said second block of data located in a corresponding column of said second array portion;
   a control means having first and second inputs, each bit of said selected byte being individually coupled to a corresponding input of said control means, and said control means having a second input coupled to the flag bit corresponding to said selected byte; and
   each of said control means having an output coupled to a data bus of Q bits.

6. The invention of claim 5 where said entire second array portion containing said flag bits is reset to a first logic state before a write operation into said first array portion is initiated;
   where said flag bits are altered to a second logic state if their corresponding data in said first array portion has been altered after said reset operation; and
   where the presence of said second logic state of a selected flag bit forces said control means to drive a desired logic combination onto said data bus.

7. The invention of claim 6 where said memory cells in all P columns of said second array portion are simultaneously reset to a preferred logic state by changing the voltage of a first power supply rail to the value of the voltage of a second power supply rail and then returning the voltage of said first power supply rail to its original value.

8. The invention of claim 5 where said first array portion of M rows and N columns and said second array portion of M rows and P columns are juxtaposed.

9. The invention of claim 8 where said memory cells reset into said preferred logic state as a result of a difference in current drive from said first power supply rail to the two storage nodes of said SRAM cells.

10. The invention of claim 5 where said N columns of said first array portion are interleaved with said P columns of said second array portion.

11. The invention of claim 5 where said memory cells in all P columns of said second array portion are simultaneously reset to a preferred logic state by changing the voltage of a first power supply rail to the value of the voltage of a second power supply rail and then returning the voltage of said first power supply rail to its original value.

* * * * *